United States Patent
Song et al.

(10) Patent No.: US 9,685,625 B2
(45) Date of Patent: Jun. 20, 2017

(54) ORGANIC LIGHT EMITTING DISPLAY DEVICE

(71) Applicant: LG Display Co., Ltd., Seoul (KR)

(72) Inventors: DongWoo Song, Seoul (KR); Hansun Park, Gyeonggi-do (KR); Eui-Doo Do, Gyeonggi-do (KR); Soohyun Kim, Gyeonggi-do (KR); MoonBae Gee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/700,314

(22) Filed: Apr. 30, 2015

(65) Prior Publication Data

US 2015/0318507 A1    Nov. 5, 2015

(30) Foreign Application Priority Data

Apr. 30, 2014    (KR) .................. 10-2014-0052359

(51) Int. Cl.
| | | |
|---|---|---|
| *H01L 51/50* | (2006.01) | |
| *H01L 51/52* | (2006.01) | |
| *H01L 51/00* | (2006.01) | |
| *H01L 27/32* | (2006.01) | |

(52) U.S. Cl.
CPC ........ *H01L 51/5096* (2013.01); *H01L 51/002* (2013.01); *H01L 51/0008* (2013.01); *H01L 51/504* (2013.01); *H01L 51/5076* (2013.01); *H01L 51/5092* (2013.01); *H01L 51/5206* (2013.01); *H01L 51/5221* (2013.01); *H01L 27/3244* (2013.01); *H01L 51/0048* (2013.01); *H01L 51/5044* (2013.01); *H01L 2251/301* (2013.01); *H01L 2251/303* (2013.01); *H01L 2251/5315* (2013.01); *H01L 2251/5346* (2013.01); *H01L 2251/558* (2013.01)

(58) Field of Classification Search
CPC .................................................. H01L 51/5096
See application file for complete search history.

(56) References Cited

U.S. PATENT DOCUMENTS

| | | | | |
|---|---|---|---|---|
| 2004/0100190 | A1* | 5/2004 | Kim | ................... H01L 51/5012 313/504 |
| 2007/0046189 | A1* | 3/2007 | Hatwar | .............. H01L 51/5278 313/506 |
| 2007/0231596 | A1* | 10/2007 | Spindler | ............. H01L 51/5052 428/690 |

\* cited by examiner

*Primary Examiner* — Lex Malsawma
(74) *Attorney, Agent, or Firm* — Morgan, Lewis & Bockius LLP (57) ABSTRACT

An organic light emitting display element includes a substrate, a lower electrode positioned on the substrate, at least one organic light emitting layer positioned on the lower electrode, a metal doped layer positioned on the organic light emitting layer, and an upper electrode positioned on the metal doped layer that includes a conductive material, and is configured to transmit light. Such organic light emitting display element is capable of minimizing degeneration and damage to the organic light emitting layer caused by sputtering.

21 Claims, 5 Drawing Sheets

ORGANIC LIGHT EMITTING DISPLAY DEVICE

CROSS-REFERENCE TO RELATED APPLICATIONS

This application claims the priority of Korean Patent Application No. 10-2014-0052359 filed on Apr. 30, 2014, in the Korean Intellectual Property Office, the disclosure of which is incorporated herein by reference.

BACKGROUND OF THE INVENTION

Field of the Invention

The present invention relates to an organic light emitting display element, and more particularly, to an organic light emitting display element in which an organic light emitting layer is protected from damage when an upper electrode is formed.

Description of the Related Art

An organic light emitting display (OLED) is a self-light emitting display device that does not need a separate light source like a liquid crystal display (LCD), and, thus, OLED devices can be manufactured to be lightweight and thin. Further, OLED devices are efficient in terms of power consumption since it is driven with a low voltage. Also, OLED devices have excellent color expression capability, a high response speed, a wide viewing angle, and a high contrast ratio (CR). Therefore, OLED devices have received much attention for next-generation displays.

In a display that uses OLED elements, it may be preferable to adopt a top-emission type structure in which light from the organic light emitting display element is emitted to an opposite side of a substrate having switching elements thereon, i.e., the so-called TFT back-plane. Adopting a top-emission type structure is advantageous in terms of aspect ratio compared to adopting a bottom-emission type structure in which the light from the organic light emitting display element is emitted to the TFT back-plane for high resolution. However, if the top-emission type structure is adopted, an upper electrode, from which light is emitted, needs to have a relatively high transmissivity to visible light and also a relatively high electrical conductivity. Thus, there would be a limit in applicable materials and in the thickness of various layers thereof.

In other words, in a top-emission organic light emitting display element display, an upper electrode needs tobe transmissive to light. Thus, the upper electrode needs to provide a relative high degree of transparency, while also serve as an electrode. If the upper electrode is a cathode, a work function of such upper electrode needs to be kept low in order to readily inject electrons. However, a metal with a low work function value and a high electrical conductivity has a very low transmissivity to visible light. Thus, if the metal is formed to have a thickness of 200 Å or more, luminance efficiency of the OLED element would be remarkably decreased.

Furthermore, in recent years, as more displays with higher resolution have been developed, a demand for large-area displays has been increased as well. As an area or size of a display increases, a sheet resistance of an upper electrode common to a front surface of a display panel also increases. As a result, non-uniformity is caused between luminance at the edge of the display and luminance at the center of the display. In order to reduce the sheet resistance, the upper electrode needs to have its thickness increased. However, in view of the foregoing, if the metal with a low work function value and a high electrical conductivity is used as a cathode in the upper electrode, it is necessary to secure transmissivity to light. Thus, there are many difficulties in increasing the thickness of the upper electrode.

Accordingly, in the relevant industry, various technologies have been applied to an organic light emitting display element in order to reduce sheet resistance of an upper electrode while securing the required light transmissivity of the upper electrode. According to one of the technologies, an upper electrode is manufactured by forming a metal having a low work function value into a very thin film in order to pass visible light. Further, an upper electrode is manufactured by forming a substance having a high transmissivity to visible light while having an electrical conductivity on the metal thin film by sputtering in order to reduce sheet resistance.

However, the related art method has at least the following problems.

When a substance with a high transmissivity to visible light while having an electrical conductivity is formed on a metal thin film, a TCO (Transparent Conductive Oxide)-based substance, such as ITO and IZO, is typically used. Such substance can be deposited only by using a sputtering method, which is one type of physical vapor deposition (PVD) method. In the sputtering method, cationized molecules (of a target) strike a deposition surface and they may degenerate or damage an already deposited organic light emitting layer, which causes various problems in the structure and/or function of a light emitting layer.

The damage on the organic light emitting layer caused from the sputtering method can be partially prevented by introducing a metal thin film. However, such metal thin film causes a micro-cavity phenomenon due to light reflective properties of metal. Thus, lights in a specific wavelength range cause constructive interference and other lights in a wavelength range that does not cause constructive interference may cause destructive interference instead. As a result, the intensity of light generated from the organic light emitting layer in a specific wavelength range increases. But a wavelength region in an emission spectrum of light generated from the organic light emitting layer becomes smaller. Eventually the white color coordinates may be distorted and the overall efficiency of white light emission may be decreased.

Thus, the inventors of the present invention have introduced a method of doping a metal dopant into an organic layer rather than using a metal thin film. They invented an organic light emitting display element in which such metal dopant does not have or has only minimal negative influences on light emission of an organic light emitting layer.

SUMMARY

Accordingly, the present invention is directed to an organic light emitting display element that substantially obviates one or more of the problems due to limitations and disadvantages of the related art An object of the present invention is to provide an organic light emitting display element that reduces a sheet resistance value of an upper electrode while not inhibiting transmissivity of the upper electrode to light.

Another object of the present invention is to provide an organic light emitting display element that prevents degeneration and damage therein that may be caused from sputtering as an applied deposition method in order to secure a low sheet resistance of an upper electrode.

Still another object of the present invention is to provide an organic light emitting display element which can have a high luminance efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display element comprises a substrate; a lower electrode positioned on the substrate; at least one organic light emitting layer positioned on the lower electrode; a metal doped layer positioned on the organic light emitting layer; and an upper electrode positioned on the metal doped layer, wherein the metal doped layer may include any one selected from aluminum-based metals (including aluminum and aluminum neodymium), alkali metals including lithium (Li), alkali earth metals including magnesium (Mg) and mixtures thereof as a metal dopant.

The effects of the present invention are not limited to the aforementioned effects, and other effects, which are not mentioned above, will be apparent to a person having ordinary skill in the art from the following description.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Advantages and features of the present invention, and methods for accomplishing the same will be more clearly understood from exemplary embodiments described below with reference to the accompanying drawings. However, the present invention is not limited to the following exemplary embodiments but may be implemented in various different forms. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like illustrated in the accompanying drawings for describing the exemplary embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure.

The terms such as "including," "having," and "consist of" used herein are generally intended to allow other components to be added unless the terms are used with the term "only".

In the present specification, any references to singular may include plural unless expressly stated otherwise.

In the present specification, components are interpreted to include an ordinary error range even if not expressly stated.

For example, when the position relation between two parts is described using the terms such as "on", "above", "below", and "next", one or more parts may be positioned between the two parts unless the terms are used with the term "immediately", "directly", "adjacently" is not used.

Although the terms "first", "second", and the like are used for describing various components, these components are not confined by these terms. These terms are merely used for distinguishing one component from the other components. Therefore, a first component to be mentioned below may be a second component in a technical concept of the present invention.

The features of various embodiments of the present invention can be partially or entirely bonded to or combined with each other and can be interlocked and operated in technically various ways as can be fully understood by a person having ordinary skill in the art, and the embodiments can be carried out independently of or in association with each other.

An organic light emitting display element according to various exemplary embodiments of the present invention will be described in detail with reference to the accompanying drawings. In the drawings, various layers as components of the organic light emitting display element according to the present invention are expressed by rectangles for convenience. Although a front surface and a side surface of each layer are illustrated as being clearly distinguished from each other, the front surface and the side surface may not be clearly distinguished from each other and may be formed to have a gentle curve shape. Therefore, in the present specification, the term "edge of a certain layer" means the "side surface" when the front and side surfaces of the layer are clearly distinguished from each other or an "edge of the front surface" when the front and side surfaces of the layer are not clearly distinguished from each other.

Figure 1:
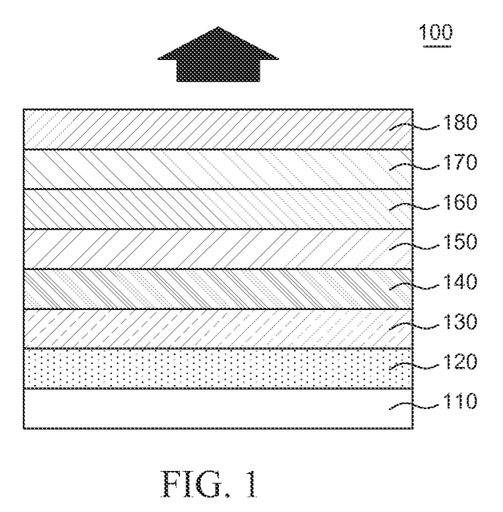
FIG. 1 illustrates a schematic structure of a top-emission organic light emitting display element in which an upper electrode is a cathode, as an organic light emitting display element according to an exemplary embodiment of the present invention.

FIG. 1 illustrates a schematic structure of a top-emission organic light emitting display element, in which an upper electrode is a cathode, as an organic light emitting display element according to an exemplary embodiment of the present invention.

Referring to FIG. 1, an organic light emitting display element 100 according to an exemplary embodiment of the present invention has a structure in which a lower electrode 120 and an upper electrode 180 facing each other are positioned on a substrate 110 including a TFT back-plane and multiple layers that are laminated (or stacked) between the lower electrode 120 and the upper electrode 180. To be more specific, the lower electrode 120 may be positioned on the substrate 110 including the TFT back-plane and an organic light emitting layer 140 may be positioned on the lower electrode 120. A metal doped layer 160 may be positioned on the organic light emitting layer 140, and the upper electrode 180 may be positioned on the metal doped layer 160. Herein, a charge transporting layer 130 may be further positioned between the lower electrode 120 and the organic light emitting layer 140. An organic buffer layer 150 may be further positioned between the organic light emitting layer 140 and the metal doped layer 160, and a charge injection layer 170 may be further positioned between the metal doped layer 160 and the upper electrode 180.

Since the metal doped layer 160 and the charge injection layer 170 are formed by, for example, chemical vapor deposition, as the charge injection layer 170 is formed on the metal doped layer 160, a surface of the metal doped layer 160 is not heavily exposed to physical impacts. However, the upper electrode 180 formed on the charge injection layer 170 is formed using a sputtering method as described above. Therefore, when the upper electrode 180 is formed, an upper surface of the charge injection layer 170 may be damaged by physical impacts. From this, a roughness at the surface of the charge injection layer 170 under the upper electrode 180 or at an interface between the upper electrode 180 and the charge injection layer 170 may be higher than a roughness at an interface between the metal doped layer 160 and the charge injection layer 170.

In FIG. 1, if the upper electrode 180 of the organic light emitting display element 100 according to the exemplary embodiment of the present invention is a cathode, an electron transfer route exists from the organic light emitting layer 140 to the upper electrode 180. Further, charges injected from the charge injection layer 170 become electrons. Herein, an additional hole injection layer may be positioned between the lower electrode 120 and the charge transporting layer 130 in some cases.

Example

Firstly, a case where the upper electrode 180 of the organic light emitting display element 100 is a cathode will be described. Herein, the case where the upper electrode 180 is a cathode means that charges provided by the upper electrode 180 to the organic light emitting layer 140 for generating excitons are electrons.

In order for the lower electrode 120 of the top-emission organic light emitting display element 100 to function as an anode, the lower electrode 120 needs to reflect light and have electrical conductivity and a high work function value. To be more specific, the lower electrode 120 is an electrode positioned in a direction opposite to a direction in which a light generated from the organic light emitting layer 140 is emitted. Thus, the lower electrode 120 needs to have a high reflectivity to visible light. In order to do so, the lower electrode 120 may further include a repeller (or other type of reflective means) to reflect and emit incident lights that are emitted from the organic light emitting layer 140 in a direction toward the upper electrode 180. Herein, the repeller may include a material, such as silver (Ag) or platinum (Pt), with a high reflectivity. Further, the lower electrode 120 needs to function as an electrode, and, thus, needs to have a high electrical conductivity. Furthermore, the lower electrode 120 needs to function as an anode, and, thus, needs to have a high work function value. Ultimately, the lower electrode 120 needs to include a material with high reflectivity and conductivity and that is also capable of providing holes, which are counterparts to electrons. For example, the lower electrode 120 may be formed of a transparent conductive oxide (TCO: hereinafter, referred to as "TCO")-based material such as ITO, IZO, and ZnO, but is not limited thereto.

In order for the upper electrode 180 of the top-emission organic light emitting display element 100 to function as a cathode, the upper electrode 180 needs to have a high transmissivity to light, a high electrical conductivity, and a relatively low work function value. To be more specific, the upper electrode 180 is an electrode positioned in the direction in which a light generated from the organic light emitting layer 140 is emitted, and, thus, needs to have a high transmissivity to visible light. Further, the upper electrode 180 needs to function as an electrode, and, thus, needs to have a high electrical conductivity. Furthermore, the upper electrode 180 needs to function as a cathode, and, thus, needs to have a low work function value. Specifically, the upper electrode 180 needs to include a material having conductivity and is also capable of providing electrons and be transmissive to light. Herein, the conductive material may include, for example, a TCO-based material such as ITO, IZO, and ZnO. Although the TCO-based material such as ITO, IZO, and ZnO may have a relatively high work function value, if matching theenergy levels between components and regulating the characteristics of the interface are performed, such TCO-based material can achieve the desirable work function value needed for an upper electrode. Therefore, the upper electrode 180 of the top-emission organic light emitting display element 100 may be formed of, for example, the TCO-based material which is transparent and has an electrical conductivity. However, the material of the upper electrode 180 is not limited to such an example.

In order to form the upper electrode 180 which includes a conductive material and transmits light, a sputtering method may be applied. For example, the method may be applied to a case where the upper electrode 180 is formed of the TCO-based material such as ITO, IZO, and ZnO. However, if the upper electrode 180 is finally deposited on the OLED element (diode) by the sputtering method, the organic light emitting layer 140 that is already deposited on the diode may be damaged and thus may not emit light due to the processof forming the organic light emitting display element. In order to prevent or minimize such damage on the organic light emitting layer 140, the metal doped layer 160 is formed on the organic light emitting layer 140 before the upper electrode 180 is deposited.

Herein, the metal doped layer 160 may be doped with a metal dopant. The metal dopant may include anyone or more selected from aluminum-based metals (including aluminum (Al) or aluminum neodymium (AlNd), alkali metals including lithium (Li), alkali earth metals including magnesium (Mg) and mixtures thereof.

Herein, a weight ratio of the metal dopant in the metal doped layer 160 may be 0.1 wt % or more and 10 wt % or less. If the weight ratio of the metal dopant is more than 10 wt %, the layer would actually become a metal thin film and an unintended micro-cavity phenomenon may occur, thus causing problems. If the weight ratio of the metal dopant is less than 0.1 wt %, the layer would not actually be doped, and, thus, an effect of preventing damage to the organic light emitting layer 140 from sputtering would not be demonstrated.

Also, as described above, the organic buffer layer 150 may be further positioned between the organic light emitting layer 140 and the metal doped layer 160. If the organic light emitting layer 140 and the metal doped layer 160 are in contact with or adjacent to each other, the metal dopant doping the metal doped layer 160 may diffuse into the organic light emitting layer 140 through an interface between the organic light emitting layer 140 and the metal doped layer 160. Since the metal dopant is likely to be cationized, the metal dopant diffusing into the organic light emitting layer 140 may trap a hole that generates excitons. Otherwise, even if the metal dopant doping the metal doped layer 160 does not diffuse into the organic light emitting layer 140, the metal dopant may trap a hole at the interface between the organic light emitting layer 140 and the metal doped layer 160. The amount of excitons corresponding to an amount of holes trapped by the metal dopant cannot be generated, and, thus, luminance efficiency is decreased. In order to prevent such a decrease in luminance efficiency of the OLED element (diode), the organic buffer layer 150 may be formed on the organic light emitting layer 140 before the metal doped layer 160 is deposited. Herein, even when some of the metal dopant in the metal doped layer 160 diffuses as time passes by, most of the metal dopant stays in the organic buffer layer 150, and, thus, an amount of the metal dopant diffusing into the organic light emitting layer 140 may be reduced or may reach 0. As such, the organic buffer layer 150 serves as a kind of barrier or blockage and the organic light emitting layer 140 may contain minimal or no metal dopant from the metal doped layer 160. Thus, it is possible to prevent the metal dopant from trapping holes for generating excitons in the organic light emitting layer 140.

In order to obtain the above-described effect, the organic buffer layer 150 may be formed with a thickness of at least 100 Å or more. If the organic buffer layer 150 has the thickness of smaller than 100 Å, it would not be sufficient to prevent holes from being trapped in the organic light emitting layer 140. Specifically, the metal dopant doping the metal doped layer 160 may diffuse into the organic light emitting layer 140 through the organic buffer layer 150 as time passes by and may trap holes in the organic light emitting layer 140. Otherwise, even if the metal dopant does not diffuse into the organic light emitting layer 140, the metal dopant diffusing into the organic buffer layer 150 may trap holes of the organic light emitting layer 140 at an interface between the organic buffer layer 150 and the organic light emitting layer 140.

Herein, each of the organic buffer layer 150 and the metal doped layer 160 may include an organic material which facilitates the transport of electrons. Herein, the organic buffer layer 150 and the metal doped layer 160 may be an organic material including a heterocyclic ring in which hetero atoms, such as nitrogen (N) or oxygen (O), with a high electro-negativity are positioned at vertices of an aromatic ring. Further, the organic buffer layer 150 may include a material having the Highest Occupied Molecular Orbital (HOMO: hereinafter, referred to as "HOMO") energy level that is lower than a HOMO energy level of a material included in the organic light emitting layer 140. Thus, this material may block holes from being transferred toward a direction of the cathode via the organic light emitting layer 140. For example, the organic buffer layer 150 and the metal doped layer 160 may independently include any one of Alq3(tris(8-hydroxyquinolino)aluminum), PBD, TAZ, Spiro-PBD, BAlq, and SAlq. Further, the organic buffer layer 150 may be formed of the same material as a host organic material of the metal doped layer 160 accounting for most of the weight in the metal doped layer 160. In other words, the metal doped layer 160 may include the same material as the host organic material that is constituted of the organic buffer layer 150.

However, even if the material, for example, the TCO-based material, included in the upper electrode 180 has a high work function value, there is a difference between a Lowest Unoccupied Molecular Orbital (LUMO: hereinafter, referred to as "LUMO") energy level of the material included in the metal doped layer 160 and the work function value of the material included in the upper electrode 180. In order for electrons to be easily transferred to the organic light emitting layer 140 from the upper electrode 180 via the metal doped layer 160, the difference needs to be reduced. Thus, before the upper electrode 180 is deposited, the charge injection layer 170 is formed on the metal doped layer 160 so that an energy barrier can be reduced. Thus, a driving voltage for transferring electrons to the organic light emitting layer 140 can be reduced.

A LUMO energy level of the material included in the charge injection layer 170 is higher than a LUMO energy level of the material included in the metal doped layer 160. Specifically, assuming that a LUMO value of a certain material is defined as a value from a vacuum energy level to a LUMO energy level, a LUMO value of the material included in the charge injection layer 170 is higher than a LUMO value of the material included in the metal doped layer 160. Further, an electron affinity of the material included in the charge injection layer 170 is lower than that of the material included in the metal doped layer 160.

Further, the electron affinity of the material included in the charge injection layer 170 is higher than a work function value of the material included in the upper electrode 180. For example, the charge injection layer 170 may include a material having an electron affinity higher than the work function value of the TCO-based material. For example, the charge injection layer 170 may include a CN-based organic material such as HATCN. Otherwise, the charge injection layer 170 may include a transition metal oxide (TMO: hereinafter, referred to as "TMO")-based material such as $WO_3$, $MoO_2$, and $Re_2O_7$. Since the charge injection layer 170 includes the material with the electron affinity that is higher than the work function value of the material included in the upper electrode 180, energy band bending in the metal doped layer 160 is further facilitated. Thus, electron injection from the upper electrode 180 to the organic light emitting layer 140 may be smoothly carried out.

Therefore, according to the top-emission organic light emitting display element in which the upper electrode 180 is a cathode, in the organic light emitting display element 100 according to the exemplary embodiment of the present invention, the lower electrode 120 is positioned on the substrate 110. The organic light emitting layer 140 is positioned on the lower electrode 120. The metal doped layer 160 is positioned on the organic light emitting layer 140. The upper electrode 180 is positioned on the metal doped layer 160. Herein, there may be at least one organic light emitting layer 140. Herein, the lower electrode 120 may further include a repeller for reflecting and radiating incident lights that are emitted from the organic light emitting layer 140 in a direction toward the upper electrode 180. Further, the charge transporting layer 130 may be further positioned on the lower electrode 120, more specifically, between the lower electrode 120 and the organic light emitting layer 140. Herein, the organic buffer layer 150 may be further positioned on the organic light emitting layer 140, more specifically, between the organic light emitting layer 140 and the metal doped layer 160. Herein, the charge injection layer 170 may be further positioned on the metal doped layer 160, more specifically, between the metal doped layer 160 and the upper electrode 180. If the upper electrode 180 is a cathode, the charge transporting layer 130 may transport a hole and the charge injection layer 170 may inject or transport an electron.

Hereinafter, a doping concentration of the metal dopant doping the metal doped layer 160 of the organic light emitting display element 100 according to the exemplary embodiment of the present invention will be descried in more detail.

FIGS. 2A to 2G are graphs illustrating doping concentrations of metal dopants in the entire area of the metal doped layer 160 in the organic light emitting display element 100 according to the exemplary embodiment of the present invention. Specifically, the graphs illustrate how the doping concentrations of the metal dopants are moved from the metal doped layer 160 interface close to the organic light emitting layer 140 toward the metal doped layer 160 interface close to the upper electrode 180.

Figure 2A:
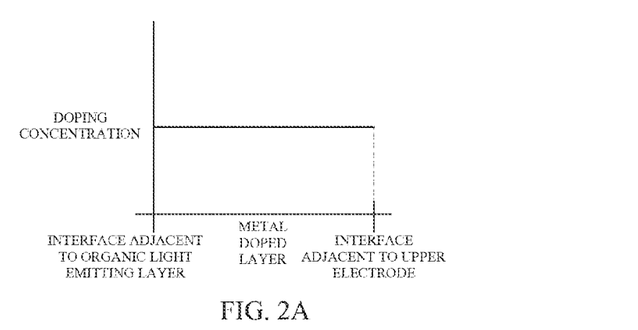
FIGS. 2A-2G are graphs illustrating doping concentrations of metal dopants in the organic light emitting display element according to the exemplary embodiment of the present invention illustrated in FIG. 1.

FIG. 2A is a graph illustrating a case where the entire area of the metal doped layer 160 is doped with a metal dopant (not illustrated) at a uniform concentration.

Figure 2B:
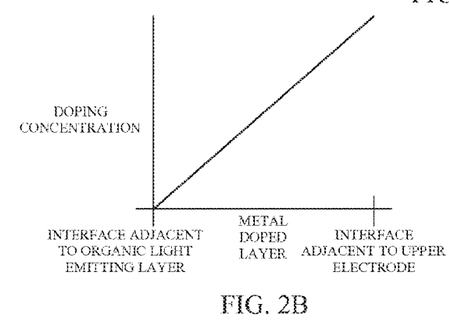
Figure 2C:
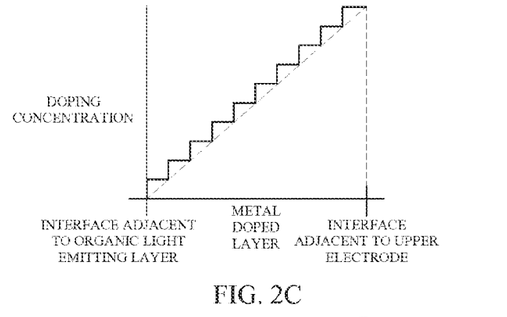

FIGS. 2B and 2C are graphs illustrating a case where a doping concentration of a metal dopant increases from the metal doped layer 160 interface close to the organic light emitting layer 140 toward the metal doped layer 160 interface close to the upper electrode 180. The rate of increase in doping concentration is positively uniform. There may be a continuous increase in doping concentration as illustrated in the graph of FIG. 2B or may be a discontinuous or step-wise increase in doping concentration as illustrated in the graph of FIG. 2C depending on a deposition environment or a condition of a deposition apparatus.

Figure 2D:
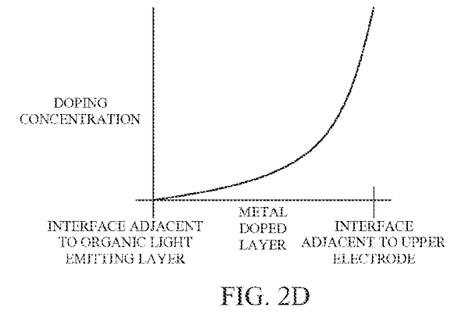
Figure 2E:
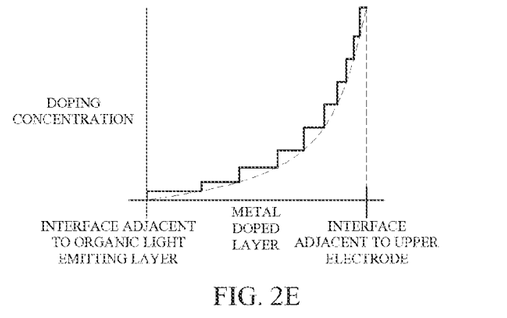

FIGS. 2D and 2E are graphs illustrating a case where a doping concentration of a metal dopant increases from the metal doped layer 160 interface close to the organic light emitting layer 140 toward the metal doped layer 160 interface close to the upper electrode 180. The rate of increase in doping concentration is positive. There may be a continuous increase in doping concentration as illustrated in the graph of FIG. 2D or may be a discontinuous or step-wise increase in doping concentration as illustrated in the graph of FIG. 2E depending on a deposition environment or a condition of a deposition apparatus.

Figure 2F:
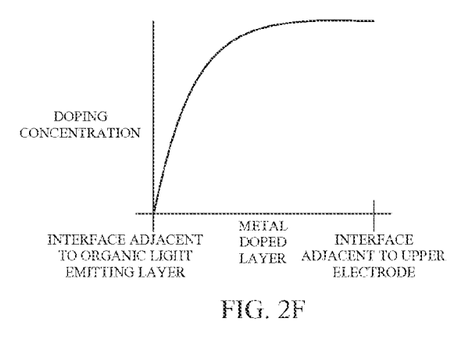
Figure 2G:
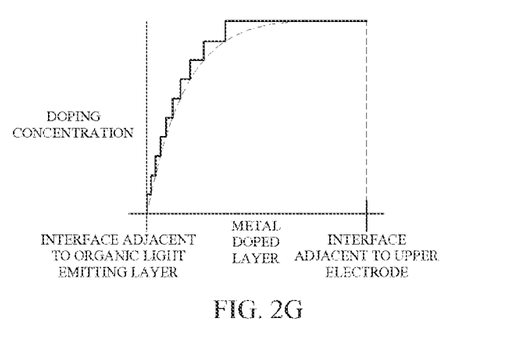

FIGS. 2F and 2G are graphs illustrating a case where a doping concentration of a metal dopant increases from the metal doped layer 160 interface close to the organic light emitting layer 140 toward the metal doped layer 160 interface close to the upper electrode 180. The rate of increase in doping concentration is negative. There may be a continuous increase in doping concentration as illustrated in the graph of FIG. 2F or may be a discontinuous or step-wise increase in doping concentration as illustrated in the graph of FIG. 2G depending on a deposition environment or a condition of a deposition apparatus.

Particularly, in the cases illustrated from FIG. 2B to FIG. 2G where the doping concentration of the metal dopant is non-uniform in the entire area of the metal doped layer 160 but is changed so as to increase toward the metal doped layer 160 interface close to the upper electrode 180 where no organic buffer layer may be present. That is, an organic light emitting display element according to another exemplary embodiment of the present invention has the same structure as the organic light emitting display element 100 according to the exemplary embodiment of the present invention except that the organic buffer layer 150 is not present and the organic light emitting layer 140 is in contact with or adjacent to the metal doped layer 160. Specifically, in the organic light emitting display element according to another exemplary embodiment of the present invention, the metal doped layer 160's interface close to the organic light emitting layer 140 is a contact surface between the organic light emitting layer 140 and the metal doped layer 160. Herein, a doping concentration of a metal dopant may be changed to allow little metal dopant to be present near the contact surface between the organic light emitting layer 140 and the metal doped layer 160. Herein, the expression "near the contact surface between the organic light emitting layer 140 and the metal doped layer 160" can mean "within a range of at least 100 Å from the contact surface between the organic light emitting layer 140 and the metal doped layer 160". Further, herein, the expression "to allow little metal dopant to be present" can mean "to allow the metal dopant to dope at a concentration low enough to not affect generation of excitons in the organic light emitting layer 140". Even if no organic buffer layer is present as such, a weight ratio of the metal dopant (not illustrated) in the metal doped layer 160 can be maintained in a range between 0.1 wt % and 10 wt %.

Further, the doping concentration of the metal dopant in the metal doped layer 160 can be changed. For example from the metal doped layer 160 interface close to the organic light emitting layer 140 toward the metal doped layer 160 interface close to the upper electrode 180, the ratio of increase in doping concentration (or rate of change) is constant in the beginning and then decreased. Otherwise, the doping concentration of the metal dopant in the metal doped layer 160 can be changed such that the ratio of increase in doping concentration is positive and uniform from the metal doped layer 160 interface close to the organic light emitting layer 140 toward the metal doped layer 160 interface close to the upper electrode 180. Alternatively, the doping concentration of the metal dopant in the metal doped layer 160 can be changed such that the ratio of increase in doping concentration is positive and then becomes negative from the metal doped layer 160 interface close to the organic light emitting layer 140 toward the metal doped layer 160 interface close to the upper electrode 180. Specifically, a doping concentration is not limited to the doping concentrations suggested in the graphs of FIG. 2 and may have various combinations thereof.

Figure 3:
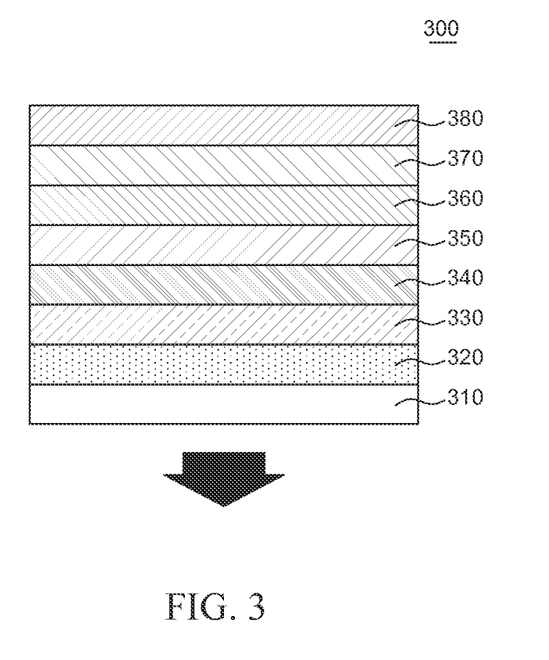
FIG. 3 illustrates a schematic structure of a bottom-emission white organic light emitting display element, in which an upper electrode is a cathode, as an organic light emitting display element according to an exemplary embodiment of the present invention.

FIG. 3 illustrates a schematic structure of a bottom-emission white organic light emitting display element, in which an upper electrode is a cathode, as an organic light emitting display element according to an exemplary embodiment of the present invention.

Referring to FIG. 3, an organic light emitting display element 300 according to an exemplary embodiment of the present invention has a structure in which a lower electrode 320 and an upper electrode 380 facing each other are positioned on a substrate 310 that includes a TFT back-plane and multiple layers that are laminated between the lower electrode 320 and the upper electrode 380. To be more specific, the lower electrode 320 may be positioned on the substrate 310 that includes the TFT back-plane. An organic light emitting layer 340 may be positioned on the lower electrode 320. A metal doped layer 360 may be positioned on the organic light emitting layer 340 and the upper electrode 380 may be positioned on the metal doped layer 360. Herein, a charge transporting layer 330 may be further positioned between the lower electrode 320 and the organic light emitting layer 340. An organic buffer layer 350 may be further positioned between the organic light emitting layer 340 and the metal doped layer 360, and a charge injection layer 370 may be further positioned between the metal doped layer 360 and the upper electrode 380.

In FIG. 3, if the upper electrode 380 of the organic light emitting display element 300 according to the exemplary embodiment of the present invention is a cathode, an electron transfer route exists from the organic light emitting layer 340 to the upper electrode 380 and charges injected from the charge injection layer 370 become electrons. Herein, an additional hole injection layer may be positioned between the lower electrode 320 and the charge transporting layer 330 in some cases.

If the upper electrode 380 of the bottom-emission organic light emitting display element 300 according to the exemplary embodiment of the present invention is a cathode, the same descriptions for the components of the top-emission organic light emitting display element 100 according to the exemplary embodiment of the present invention except the anode apply hereto. That is, the same descriptions for the substrate 110, the charge transporting layer 130, the organic light emitting layer 140, the organic buffer layer 150, the metal doped layer 160, and the charge injection layer 170 of the top-emission organic light emitting display element 100 respectively apply to the descriptions for the substrate 310, the charge transporting layer 330, the organic light emitting layer 340, the organic buffer layer 350, the metal doped layer 360, and the charge injection layer 370 of the bottom-emission organic light emitting display element 300. Therefore, in the description for the organic light emitting display element 300 according to the exemplary embodiment of the present invention, substantially the same explanation as that for the organic light emitting display element 100 according to the exemplary embodiment of the present invention will be omitted, and explanation for different components will be further provided.

Example

In order for the lower electrode 320 of the bottom-emission organic light emitting display element 300 to function as an anode, the lower electrode 320 needs to have a high transmissivity to light and also have a high electrical conductivity and a high work function value. To be more specific, the lower electrode 320 is an electrode positioned in a direction in which a light generated from the organic light emitting layer 340 is emitted, and, thus, needs to have a high transmissivity to visible light. Further, the lower electrode 320 needs to function as an electrode, and, thus, needs to have a high electrical conductivity. Furthermore, the lower electrode 320 needs to function as an anode, and, thus, needs to have a high work function value. Specifically, the lower electrode 320 needs to include a material having conductivity and capable of transmitting light and providing holes. For example, the lower electrode 320 may be a transparent conductive material including a TCO-based material such as ITO, IZO, and ZnO, but is not limited thereto.

In order for the upper electrode 380 of the bottom-emission organic light emitting display element 300 to function as a cathode, the upper electrode 380 needs to have a high electrical conductivity and a relatively low work function value. To be more specific, the upper electrode 380 is an electrode positioned in a direction opposite to the direction in which a light generated from the organic light emitting layer 340 is emitted, and, thus, needs to have a high reflectivity to light. Further, the upper electrode 380 needs to function as an electrode, and, thus, needs to have a high electrical conductivity. Furthermore, the upper electrode 380 needs to function as a cathode, and, thus, needs to have a low work function value. Ultimately, the upper electrode 380 needs to include a material with conductivity and which is also capable of providing electrons. Herein, as a conductive material with a relatively low work function value can be included in the upper electrode 380, for example, alkali metals or alkali earth metals such as magnesium (Mg), lithium (Li), calcium (Ca), sodium (Na), potassium (K), rubidium (Rb), barium (Ba) and alloys thereof may be used.

In order to form the upper electrode 380 of the bottom-emission organic light emitting display element 300, the sputtering method may also be applied. In this case, the related art problem that occurs when an upper electrode of a top-emission organic light emitting display element is formed by the sputtering method also occurs. Therefore, the bottom-emission organic light emitting display element 300 needs to have an organic light emitting display element structure including the metal doped layer 160 doped with the metal dopant in the same manner as the top-emission organic light emitting display element 100.

Example

Figure 4:
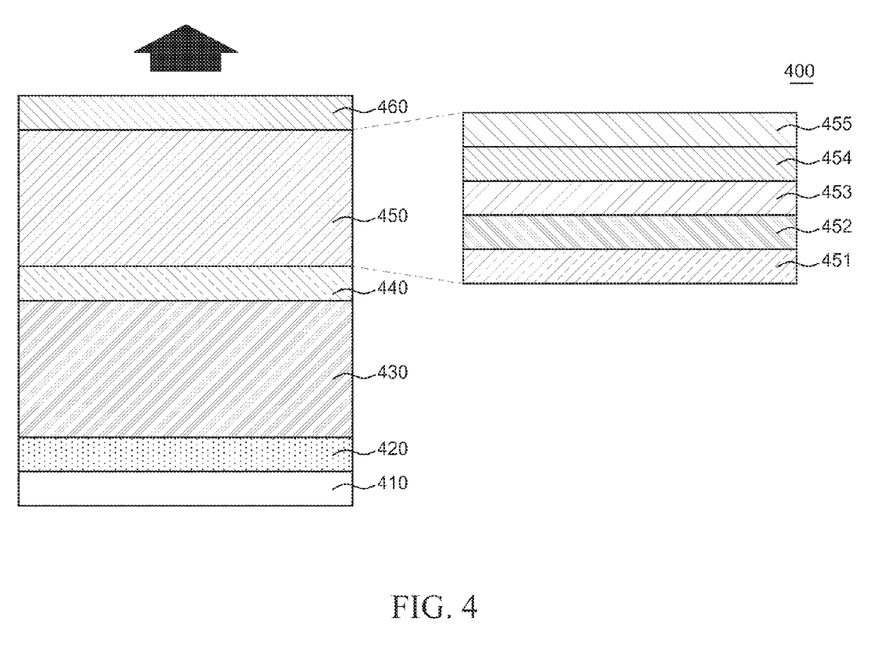
FIG. 4 illustrates a schematic structure of a top-emission white organic light emitting display element, in which an upper electrode is a cathode and multiple organic light emitting display elements are stacked or laminated, as an organic light emitting display element according to an exemplary embodiment of the present invention.

FIG. 4 illustrates a schematic structure of a top-emission white organic light emitting display element, in which an upper electrode is a cathode and multiple organic light emitting display elements are stacked or laminated, as an organic light emitting display element according to an exemplary embodiment of the present invention.

Referring to FIG. 4, an organic light emitting display element 400 according to an exemplary embodiment of the present invention has a structure in which a lower electrode 420 and an upper electrode 460 facing each other are positioned on a substrate 410 that includes a TFT back-plane and multiple layers including a first light emitting unit 430, a charge generation layer 440, and a second light emitting unit 450 that are stacked or laminated between the lower electrode 420 and the upper electrode 460. To be more specific, the lower electrode 420 may be positioned on the substrate 410 that includes the TFT back-plane. The first light emitting unit 430 may be positioned on the lower electrode 420 and the charge generation layer 440 may be positioned on the first light emitting unit 430. The second light emitting unit 450 may be positioned on the charge generation layer 440, and the upper electrode 460 may be positioned on the second light emitting unit 450.

The organic light emitting display element 400 will be described in more detail focusing on the second light emitting unit 450 and the upper electrode 460.

The second light emitting unit 450 basically includes an organic light emitting layer 452 and a metal doped layer 454. Herein, a charge transporting layer 451 may be further positioned under the organic light emitting layer 452. An organic buffer layer 453 may be further positioned between the organic light emitting layer 452 and the metal doped layer 454, and a charge injection layer 455 may be further positioned between the metal doped layer 454 and the upper electrode 460.

The same descriptions for the substrate 410, the lower electrode 420, the charge transporting layer 451, the organic light emitting layer 452, the organic buffer layer 453, the metal doped layer 454, the charge injection layer 455, and the upper electrode 460 of the organic light emitting display element 400 according to the exemplary embodiment of the present invention respectively apply to the descriptions for the substrate 110, the lower electrode 120, the charge transporting layer 130, the organic light emitting layer 140, the organic buffer layer 150, the metal doped layer 160, the charge injection layer 170, and the upper electrode 180 of the organic light emitting display element 100 according to the exemplary embodiment of the present invention. Therefore, in the description for the organic light emitting display element 400 according to the exemplary embodiment of the present invention, substantially the same explanation as that for the organic light emitting display element 100 according to the exemplary embodiment of the present invention will be omitted merely for the sake of brevity, and explanation for different or added components will be further provided.

Herein, the first light emitting unit 430 emits a first light, and the second light emitting unit 450 emits a second light. The first light emitted from the first light emitting unit 430 and the second light emitted from the second light emitting unit 450 complement each other. Thus, the first light and the second light are combined to become white light. For example, if the first light emitted from the first light emitting unit 430 is a blue light, the second light emitted from the second light emitting unit 450 is a yellow-green light. If the first light emitted from the first light emitting unit 430 is a yellow-green light, the second light emitted from the second light emitting unit 450 is a blue light.

The charge generation layer 440 provides electrons and holes to the first light emitting unit 430 and the second light emitting unit 450, respectively.

Figure 5:
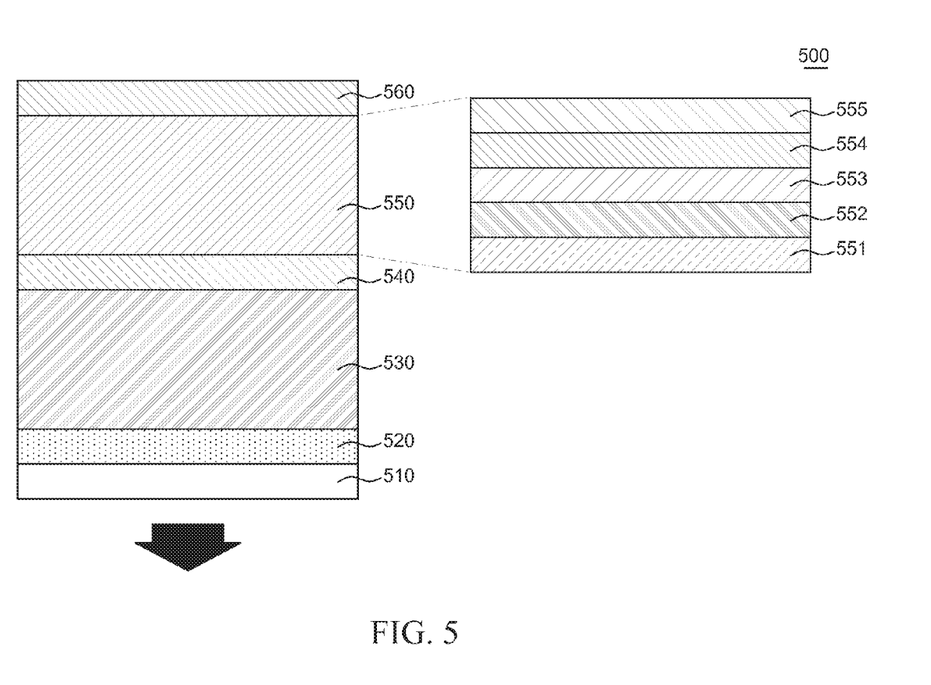
FIG. 5 illustrates a schematic structure of a bottom-emission white organic light emitting display element, in which an upper electrode is a cathode and multiple organic light emitting display elements are stacked or laminated, as an organic light emitting display element according to an exemplary embodiment of the present invention.

FIG. 5 illustrates a schematic structure of a bottom-emission white organic light emitting display element, in which an upper electrode is a cathode and multiple organic light emitting display elements are stacked or laminated, as an organic light emitting display element according to an exemplary embodiment of the present invention.

Referring to FIG. 5, an organic light emitting display element 500 according to an exemplary embodiment of the present invention has a structure in which a lower electrode 520 and an upper electrode 560 facing each other are positioned on a substrate 510 that includes a TFT back-plane and multiple layers including a first light emitting unit 530, a charge generation layer 540, and a second light emitting unit 550 that are stacked or laminated between the lower electrode 520 and the upper electrode 580. To be more specific, the lower electrode 420 may be positioned on the substrate 410 that includes the TFT back-plane. The first light emitting unit 530 may be positioned on the lower electrode 520 and the charge generation layer 540 may be positioned on the first light emitting unit 530. The second light emitting unit 550 may be positioned on the charge generation layer 540 and the upper electrode 560 may be positioned on the second light emitting unit 550.

In the organic light emitting display element 500 according to the exemplary embodiment of the present invention, the key points of the invention are the second light emitting unit 550 and the upper electrode 560. Thus, the organic light emitting display element 500 will be described in more detail focusing on the second light emitting unit 550 and the upper electrode 560.

The second light emitting unit 550 basically includes an organic light emitting layer 552 and a metal doped layer 554. Herein, a charge transporting layer 551 may be further positioned under the organic light emitting layer 552. An organic buffer layer 553 may be further positioned between the organic light emitting layer 552 and the metal doped layer 554, and a charge injection layer 555 may be further positioned between the metal doped layer 554 and the upper electrode 560.

The same descriptions for the substrate 510, the lower electrode 520, the charge transporting layer 551, the organic light emitting layer 552, the organic buffer layer 553, the metal doped layer 554, the charge injection layer 555, and the upper electrode 560 of the organic light emitting display element 500 according to the exemplary embodiment of the present invention respectively apply to the descriptions for the substrate 310, the lower electrode 320, the charge transporting layer 351, the second organic light emitting layer 352, the organic buffer layer 353, the metal doped layer 354, the charge injection layer 355, and the upper electrode 360 of the organic light emitting display element 300 according to the exemplary embodiment of the present invention. Therefore, in the description for the organic light emitting display element 500 according to the exemplary embodiment of the present invention, substantially the same explanation as that of the organic light emitting display element 300 according to the exemplary embodiment of the present invention will be omitted, and explanation for different or added components will be further provided.

Herein, the first light emitting unit 530 emits a first light, and the second light emitting unit 550 emits a second light. The first light emitted from the first light emitting unit 530 and the second light emitted from the second light emitting unit 550 complement each other. Thus, the first light and the second light are combined to become white light. For example, if the first light emitted from the first light emitting unit 530 is a blue light, the second light emitted from the second light emitting unit 550 is a yellow-green light. If the first light emitted from the first light emitting unit 530 is a yellow-green light, the second light emitted from the second light emitting unit 550 is a blue light.

The charge generation layer 540 provides electrons and holes to the first light emitting unit 530 and the second light emitting unit 550, respectively. An organic light emitting display element according to an exemplary embodiment of the present invention may have a structure including, for example, three or more light emitting units. Even in this case, if an upper electrode formed on an organic light emitting layer includes a material which can be deposited only by the sputtering method due to a work function value or an electrical conductivity, the same descriptions for the organic light emitting display elements 100, 300, 400, and 500 according to the exemplary embodiments of the present invention apply hereto. That is, if the organic light emitting display element including, for example, three or more light emitting units according to the exemplary embodiment of the present invention corresponds to the top-emission white organic light emitting display element, the same description for the organic light emitting display element 400 according to the exemplary embodiment of the present invention apply hereto. Also if corresponding to bottom-emission white organic light emitting display element, the same description for the organic light emitting display element 500 according to the exemplary embodiment of the present invention apply hereto.

Further, an organic light emitting display element according to an exemplary embodiment of the present invention may be configured as (1) a bi-directional light emission type organic light emitting display element or (2) a transparent organic light emitting display element by forming both of an upper electrode and a lower electrode to be translucent or transparent. Even in this case, if an upper electrode formed on an organic light emitting layer include a material which can be deposited only by the sputtering method due to a work function value or electrical conductivity, the same descriptions for the organic light emitting display elements 100, 300, 400, and 500 according to the exemplary embodiments of the present invention apply hereto. That is, the organic light emitting display element according to the exemplary embodiment of the present invention may include the organic light emitting layer 140 positioned on the lower electrode 120 and the metal doped layer 160 positioned on the organic light emitting layer 140, between the upper electrode 180 that transmits light and the lower electrode 320 that transmits light. Herein, the charge transporting layer 130 may be further positioned between the lower electrode 320 and the organic light emitting layer 140. The organic buffer layer 150 may be further positioned between the organic light emitting layer 140 and the metal doped layer 160, and the charge injection layer 170 may be further positioned between the metal doped layer 160 and the upper electrode 180.

Hereinafter, experimental data that describes an effect of a metal buffer layer on prevention of damage to an organic light emitting layer will be described.

Comparative experiments and/or examples of the present invention correspond to a top-emission yellow-green organic light emitting display element that includes a single light emitting unit in which an organic light emitting layer emits a yellow-green light.

Comparative Example 1 corresponds to a top-emission yellow-green organic light emitting display element that includes an organic buffer layer/a metal thin film (MgAg)/an upper electrode (IZO). Although light emission was observed, a color of the light seemed to be almost green and the luminance was not high.

Comparative Example 2 corresponds to a top-emission yellow-green organic light emitting display element that includes an organic buffer layer/an upper electrode (IZO). Specifically, the metal thin film (MgAg) is not present, as compared with Comparative Example 1. In Comparative Example 2, it was observed that light emission did not occur. It can be seen that since the metal thin film (MgAg) that prevents an organic light emitting layer from being degenerated or damaged in a process of forming the upper electrode (IZO) by sputtering was omitted, the organic light emitting layer was degenerated or damaged and thus the OLED element (diode) could not emit light.

Example 1 corresponds to a top-emission yellow-green organic light emitting display element that includes an organic buffer layer/a metal doped layer (Li)/an upper electrode (IZO). As light was emitted, a color of the light seemed to be yellow with green hue, and the luminance was increased as compared with Comparative Example 1.

Example 2 corresponds to a top-emission yellow-green organic light emitting display element that includes an organic buffer layer/a metal doped layer (Li)/a charge injection layer/an upper electrode (IZO). As light was emitted, a color of the light seemed to be yellow with green hue, and the luminance was increased as compared with Comparative Example 1.

Table 1 shows the results of performance evaluation for the OLE elements (diodes) in Comparative Example 1 to Example 2. More specifically, it shows driving voltage (V), luminance efficiency (Cd/A), and power efficiency (lm/W) for the diodes in Comparative Example 1 to Example 2.

TABLE 1

|  | V | Cd/A | lm/W |
| --- | --- | --- | --- |
| Comparative Example 1 | 5.1 | 25.1 | 15.4 |
| Comparative Example 2 | — | — | — |
| Example 1 | 3.9 | 36.9 | 29.5 |
| Example 2 | 4.1 | 48.8 | 37.1 |

It can be seen that the metal thin film or the metal doped layer is not included as shown in Comparative Example 2 and thus light was not emitted.

It can be seen that the driving voltage for the OLED element (diode) is remarkably decreased and luminance efficiency is increased in Example 1 that includes the metal doped layer, as compared with Comparative Example 1 that includes the metal thin film.

It can be seen that luminance efficiency is further increased in Example 2 where the charge injection layer is included in addition to Example 1 that includes the metal doped layer.

Thus, the OLED element (diode) exhibits the higher performance where the metal doped layer is included, as compared with the case where the metal thin film is included. It can be seen that even if the metal doped layer is included, when the charge injection layer is further included, the OLED element (diode) exhibits a higher performance. Such a result is the same with the top-emission white organic light emitting display element. Details thereof will be described hereinafter.

Table 2 shows the results of performance evaluation for the top-emission white organic light emitting display elements in Comparative Experiments and Examples of the present invention. Herein, Comparative Experiments and Examples of the present invention correspond to a top-emission white organic light emitting display element that includes an organic light emitting layer in which a first light emitting unit that emits a blue light and a second light emitting unit that emits a yellow-green light are stacked or laminated.

Comparative Example 3 corresponds to a top-emission white organic light emitting display element that includes an organic buffer layer/a metal doped layer (Li)/a metal thin film (MgAg)/an upper electrode (IZO).

Example 3 corresponds to a top-emission white organic light emitting display element that includes a metal doped layer (Li)/an upper electrode (IZO).

Example 4 corresponds to a top-emission white organic light emitting display element that includes an organic buffer layer/a metal doped layer (Li)/a charge injection layer/an upper electrode (IZO).

TABLE 2

|  | V | Cd/A | lm/W |
| --- | --- | --- | --- |
| Comparative Example 3 | 11.6 | 38.2 | 10.3 |
|  | 11.7 | 43.4 | 11.7 |
|  | 11.8 | 49.9 | 13.3 |

TABLE 2-continued

|  | V | Cd/A | lm/W |
|---|---|---|---|
| Example 3 | 9.8 | 58.5 | 18.6 |
|  | 9.9 | 63.4 | 24.5 |
|  | 9.9 | 66.6 | 21.0 |
| Example 4 | 10.4 | 63.2 | 19.0 |
|  | 10.7 | 70.9 | 20.8 |
|  | 10.8 | 75.7 | 22.0 |

Example 3 that includes only the metal doped layer can be seen as being relatively superior in terms of driving voltage and luminance efficiency to the Comparative Example 3 that includes the organic buffer layer and the metal thin film.

It can be seen that Example 4 that includes the organic buffer layer and the charge injection layer on both sides of the metal doped layer has a somewhat higher driving voltage, but has increased luminance efficiency as compared with Example 3. The driving voltage may be somewhat increased due to the effects of added layers but the luminance efficiency is also increased. Thus, there would be no problem in terms of overall power efficiency or power consumption. Basically, an organic light emitting display element is a current-driven element or device. In other words, the brightness of a display that uses the organic light emitting display element is proportional to an amount of current conducted between an anode and a cathode of the diode. Thus, luminance, i.e., luminance efficiency, with respect to a unit current, can be considered as an important characteristic of a display that uses the organic light emitting display element. Therefore, it is worthy to note that improvement in luminance efficiency in evaluating of performance of Example 4.

Thus, it can be seen that the diode has a higher performance when the metal doped layer is included, instead of the metal thin film. Moreover, when the organic buffer layer and the charge injection layer are further included, the OLED element (diode) exhibit higher performance.

Therefore, in the organic light emitting display element according to the exemplary embodiments of the present invention, when the upper electrode used in forming the organic light emitting display element is deposited by sputtering, the metal doped layer for preventing the organic light emitting layer from being damaged or degenerated is positioned on the organic light emitting layer. Herein, the diode is configured such that the metal dopant of the metal doped layer does not trap holes in the organic light emitting layer. Herein, the metal dopant doping the metal doped layer may include any one or more selected from aluminum-based metals selected among aluminum or aluminum neodymium, alkali metals, alkali earth metals, and mixtures thereof. Herein, a doping concentration of the metal dopant doping the metal doped layer may increase from an area close to the organic light emitting layer toward an area close to the upper electrode. This organic light emitting display element is capable of reducing a sheet resistance value of the upper electrode while not inhibiting transmissivity of the upper electrode to light. Further, it is capable of preventing degeneration and damage to an organic light emitting layer caused by sputtering, and is also capable of securing high diode efficiency.

The organic light emitting display element according to the exemplary embodiment of the present invention includes the substrate; the lower electrode positioned on the substrate; at least one organic light emitting layer positioned on the lower electrode; a metal doped layer positioned on the organic light emitting layer; and an upper electrode positioned on the metal doped layer and including a conductive material and transmitting light, wherein the metal doped layer may include the metal dopant including any one or more selected from aluminum-based metals, alkali metals, alkali earth metals, and mixtures thereof.

Herein, the upper electrode may include a conductive material selected from materials that can be deposited by a sputtering method.

Herein, the lower electrode may include a conductive material and has light transmissive properties, and the upper electrode is formed of a conductive material selected from materials that can be deposited by a sputtering method.

Herein, the first light emitting unit positioned on the lower electrode is configured to emit the first light. The charge generation layer positioned on the first light emitting unit and the second light emitting unit positioned on the charge generation layer are configured to emit the second light, and include the organic light emitting layer and the metal doped layer that may be further included. The upper electrode is positioned on the second light emitting unit which includes a conductive material selected from materials that can be deposited by a sputtering method. The first light and the second light are combined to become white light.

Herein, the first light emitting unit positioned on the lower electrode is configured to emit the first light and the charge generation layer is positioned on the first light emitting unit. The second light emitting unit positioned on the charge generation layer is configured to emit the second light and includes the organic light emitting layer and the metal doped layer that may be further included. The lower electrode includes a conductive material and transmits light. The upper electrode is positioned on the second light emitting unit and includes a transparent conductive material. The first and second lights are combined to become white light.

Herein, the organic buffer layer positioned between the organic light emitting layer and the metal doped layer may be further included.

Herein, the metal dopant may not be present in the organic buffer layer.

Herein, the charge injection layer positioned on the metal doped layer may be further included.

Herein, an electron affinity of the material included in the charge injection layer may be higher than an electron affinity of the material included in the upper electrode.

Herein, the charge injection layer may be formed of a CN-based organic material or TMO (Transition Metal Oxide).

Herein, a surface roughness between the charge injection layer and the upper electrode is higher than a surface roughness at an interface between the charge injection layer and the metal doped layer.

Herein, the metal doped layer may include the same material as the material constituting the organic buffer layer.

Herein, the organic buffer layer may have a thickness of 100 Å or more.

Herein, the metal dopant is at a uniform concentration in the entire area of the metal doped layer.

Herein, in the metal doped layer, a doping concentration of the metal dopant may relatively increase in an area closer to the organic light emitting layer and may relatively decrease in an area closer to the upper electrode.

Herein, a weight ratio of the metal dopant in the metal doped layer may be 0.1 wt % or more and 10 wt % or less.

Herein, there may be a continuous increase in doping concentration of the metal dopant in the metal doped layer from an area close to the organic light emitting layer toward an area close to the upper electrode.

Herein, there may be a discontinuous or step-wise increase in doping concentration of the metal dopant in the metal doped layer from an area close to the organic light emitting layer toward an area close to the upper electrode.

The organic light emitting display element according to the present invention can prevent the organic light emitting layer from being damaged or degenerated. This can be achieved when the upper electrode used in forming the organic light emitting display element is deposited by sputtering.

Further, the organic light emitting display element according to embodiments of the present invention can reduce a sheet resistance value of the upper electrode while not inhibiting transmissivity of the upper electrode to light, as compared to the related art OLED elements.

Furthermore, the organic light emitting display element according to the present invention can have high luminance efficiency.

It will be apparent to those skilled in the art that various modifications and variations can be made in the organic light emitting display element of the present invention without departing from the spirit or scope of the invention. Thus, it is intended that the present invention cover the modifications and variations of this invention provided they come within the scope of the appended claims and their equivalents.

EXPLANATION OF CODES

400: Top-emission white organic light emitting display element
410: Substrate
420: Lower electrode
430: First light emitting unit
431: First organic light emitting layer
440: Charge generation layer
450: Second light emitting unit
451: Charge transporting layer
452: Second organic light emitting layer
453: Organic buffer layer
454: Metal doped layer
455: Charge injection layer
460: Upper electrode

What is claimed is:

1. An organic light emitting display element comprising:
   a substrate;
   a lower electrode on the substrate;
   at least one organic light emitting layer on the lower electrode;
   an upper electrode on the organic light emitting layer; and
   a metal doped layer disposed between the organic light emitting layer and the upper electrode to minimize damage on the organic light emitting layer when depositing the upper electrode;
   wherein the metal doped layer includes a metal dopant including at least one among aluminum-based metals, alkali metals, alkali earth metals, and mixtures thereof, and
   wherein, in the metal dopant layer, a doping concentration of the metal dopant relatively increases in an area closer to the organic light emitting layer and relatively decreases in an area closer to the upper electrode.

2. The organic light emitting display element according to claim 1, wherein the upper electrode includes a conductive material deposited by a sputtering method.

3. The organic light emitting display element according to claim 2, wherein the lower electrode includes a conductive material having light transmissive properties.

4. The organic light emitting display element according to claim 1, further comprising:
   a first light emitting unit on the lower electrode and configured to emit a first light;
   a charge generation layer on the first light emitting unit; and
   a second light emitting unit on the charge generation layer and configured to emit a second light and includes the organic light emitting layer and the metal doped layer,
   wherein the upper electrode is on the second light emitting unit and include a conductive material deposited by a sputtering method, and
   wherein the first light and the second light are combined to form white light.

5. The organic light emitting display element according to claim 1, further comprising:
   a first light emitting unit on the lower electrode and configured to emit a first light;
   a charge generation layer on the first light emitting unit; and
   a second light emitting unit on the charge generation layer and configured to emit a second light and includes the organic light emitting layer and the metal doped layer,
   wherein the lower electrode includes a conductive material and has light transmissive properties,
   wherein the upper electrode is on the second light emitting unit and includes a transparent conductive material, and
   wherein the first light and the second light are combined to form white light.

6. The organic light emitting display element according to claim 1, further comprising:
   an organic buffer layer between the organic light emitting layer and the metal doped layer.

7. The organic light emitting display element according to claim 6, wherein the organic buffer layer does not include the metal dopant.

8. The organic light emitting display element according to claim 1, further comprising:
   a charge injection layer on the metal doped layer.

9. The organic light emitting display element according to claim 8, wherein an electron affinity of a material included in the charge injection layer is higher than an electron affinity of a material included in the upper electrode.

10. The organic light emitting display element according to claim 8, wherein the charge injection layer includes a CN-based organic material or TMO (Transition Metal Oxide).

11. The organic light emitting display element according to claim 8, wherein a surface roughness at an interface between the charge injection layer and the upper electrode is higher than a surface roughness at an interface between the charge injection layer and the metal doped layer.

12. The organic light emitting display element according to claim 1, wherein the metal doped layer includes the same material as that of the organic buffer layer.

13. The organic light emitting display element according to claim 1, wherein the organic buffer layer has a thickness of 100 Å or more.

14. The organic light emitting display element according to claim 1, wherein a weight ratio of the metal dopant in the metal doped layer is 0.1 wt % or more and 10 wt % or less.

15. The organic light emitting display element according to claim 1, wherein the doping concentration of the metal dopant in the metal doped layer increases continuously from the area close to the organic light emitting layer toward the area close to the upper electrode.

16. The organic light emitting display element according to claim 1, wherein the doping concentration of the metal dopant in the metal doped layer increases discontinuously or in a step-wise manner from the area close to the organic light emitting layer toward the area close to the upper electrode.

17. An apparatus comprising:
- an organic light emitting structure configured to be implemented in a display device;
- an upper electrode, above the organic light emitting structure, configured to function as a cathode by having an oxide-based material with relatively high transparent and conductive properties;
- a TFT backplane, under the organic light emitting structure, with a lower electrode configured to function as an anode by having relatively high work function and high reflectivity properties; and
- a metal doped layer having the metal dopant, wherein the weight ratio of the metal dopant is within a range of 0.1 wt % to 10 wt %, wherein the organic light emitting structure is further configured to include an organic light emitting layer, and wherein the metal dopant layer has a weight ratio that is sufficient to provide effective protection to the organic light emitting layer but without exhibiting detrimental micro-cavity characteristics.

18. The apparatus of claim 17, wherein the metal doped layer is disposed between the organic light emitting layer and the upper electrode.

19. The apparatus of claim 18, wherein the metal dopant includes at least one among aluminum-based metals, alkali metals, alkali earth metals, and mixtures thereof.

20. The apparatus of claim 17, further comprising: an organic buffer layer between the organic light emitting layer and the metal doped layer.

21. The apparatus of claim 20, wherein the metal doped layer includes the same material as that of the organic buffer layer.

* * * * *